United States Patent
Kim et al.

(10) Patent No.: US 7,773,448 B2
(45) Date of Patent: Aug. 10, 2010

(54) SEMICONDUCTOR MEMORY DEVICE

(75) Inventors: Dae-Suk Kim, Kyoungki-Do (KR);
Jin-Hee Cho, Kyoungki-Do (KR)

(73) Assignee: Hynix Semiconductor, Inc.,
Gyeonggi-do (KR)

( * ) Notice: Subject to any disclaimer, the term of this patent is extended or adjusted under 35 U.S.C. 154(b) by 91 days.

(21) Appl. No.: 12/136,487

(22) Filed: Jun. 10, 2008

(65) Prior Publication Data
US 2009/0168587 A1    Jul. 2, 2009

(30) Foreign Application Priority Data
Dec. 26, 2007  (KR) .................. 10-2007-0138020

(51) Int. Cl.
*G11C 8/00* (2006.01)
(52) U.S. Cl. .............................. 365/230.03; 365/230.08
(58) Field of Classification Search ............ 365/230.03, 365/230.08, 63
See application file for complete search history.

(56) References Cited

U.S. PATENT DOCUMENTS 6,144,577 A * 11/2000 Hidaka ......................... 365/63
7,180,817 B2 * 2/2007 Mochida ................. 365/230.03
7,596,049 B2 * 9/2009 Jeong et al. ............ 365/230.03

FOREIGN PATENT DOCUMENTS

| KR | 1020010027117 A | 4/2001 |
| KR | 1020030001870 A | 1/2003 |
| KR | 1020090001255 A | 1/2009 |

OTHER PUBLICATIONS

Notice of Preliminary Rejection issued from Korean Intellectual Property Office on Dec. 21, 2009.

* cited by examiner

*Primary Examiner*—Anh Phung
(74) *Attorney, Agent, or Firm*—IP & T Law Firm PLC

(57) ABSTRACT

A semiconductor memory device having multiple banks each including multiple memory blocks arranged in column and row directions. The memory blocks are divided into multiple memory block groups each sharing a corresponding column select signal. The memory blocks belonging to the respective memory block groups are arranged adjacently in the column direction. Multiple global input/output lines are separately connected to the memory block groups of the respective banks to transfer data of the memory blocks belonging to the respective memory block groups in a time division manner.

7 Claims, 5 Drawing Sheets

FIG. 4A

DDR2 SDRAM
4BIT PREFETCH 1BANK CONFIGURATION

| U0 | U2 | U1 | U3 |
|----|----|----|----|
| D0 | D2 | D1 | D3 |

FIG. 4B

DDR3 SDRAM
8BIT PREFETCH 1BANK CONFIGURATION

| U0 | U4 | U1 | U5 | U2 | U6 | U3 | U7 |
|----|----|----|----|----|----|----|----|
| D0 | D4 | D1 | D5 | D2 | D6 | D3 | D7 |

FIG. 4C

DDR4 SDRAM
16BIT PREFETCH 1BANK CONFIGURATION

| U0 | U8 | U1 | U9 | U2 | U10 | U3 | U11 | U4 | U12 | U5 | U13 | U6 | U14 | U7 | U15 |
|----|----|----|----|----|-----|----|-----|----|-----|----|-----|----|-----|----|-----|
| D0 | D8 | D1 | D9 | D2 | D10 | D3 | D11 | D4 | D12 | D5 | D13 | D6 | D14 | D7 | D15 |

FIG. 4D

DDR5 SDRAM
32BIT PREFETCH 1BANK CONFIGURATION

| U0 | U16 | U1 | U17 | U2 | U18 | U3 | U19 | U4 | U20 | U5 | U21 | U6 | U22 | U7 | U23 | U8 | U24 | U9 | U25 | U10 | U26 | U11 | U27 | U12 | U28 | U13 | U29 | U14 | U30 | U15 | U31 |
|---|---|---|---|---|---|---|---|---|---|---|---|---|---|---|---|---|---|---|---|---|---|---|---|---|---|---|---|---|---|---|---|
| D0 | D16 | D1 | D17 | D2 | D18 | D3 | D19 | D4 | D20 | D5 | D21 | D6 | D22 | D7 | D23 | D8 | D24 | D9 | D25 | D10 | D26 | D11 | D27 | D12 | D28 | D13 | D29 | D14 | D30 | D15 | D31 |

FIG. 4E

N Bit PREFETCH 1BANK CONFIGURATION

| 00 | N/2 | 01 | N/2+1 | 02 | N/2+2 | ... | N/2-3 | N-3 | N/2-2 | N-2 | N/2-1 | N-1 |
|---|---|---|---|---|---|---|---|---|---|---|---|---|

SEMICONDUCTOR MEMORY DEVICE

CROSS-REFERENCE TO RELATED APPLICATIONS

The present invention claims priority of Korean patent application number 10-2007-0138020, filed on Dec. 26, 2007, which is incorporated by reference in its entirety.

BACKGROUND OF THE INVENTION

The present invention relates to a semiconductor device, and more particularly, to a semiconductor memory device using a serial-to-parallel scheme. In particular, the invention relates to a semiconductor memory device having global input/output lines with relatively short lengths.

Typical DRAMs such as DDR/DDR2 synchronous DRAM (SDRAMs) input/output data using a serial-to-parallel scheme.

The serial-to-parallel scheme is to input/output data to/from memory cells inside the semiconductor memory device in a serial fashion, but input/output data to/from the outside of the semiconductor memory device in a parallel fashion. The number of data input/output at a time in a parallel fashion is referred to as a data bandwidth. The mode of the semiconductor memory device may be determined according to the data bandwidth.

For example, a semiconductor memory device operating in an X4 mode can input/output four bits of data at a time, and a semiconductor memory device operating in an X8 mode can input/output eight bits of data at a time. Also, a semiconductor memory device operating in an X16 mode can input/output sixteen bits of data at a time.

Meanwhile, as the SDRAM specification changes from DDR SDRAM to DDR2 SDRAM, an N-bit prefetch scheme is used to read or write data corresponding to a minimum burst length in response to one read or write command in each data (DQ) input/output buffer in order to cope with a high frequency operation, where N is equal to the minimum burst length.

A DDR SDRAM uses a 2-bit prefetch scheme to access 2-bit data stored in memory cells in each clock cycle and output the accessed 2-bit data to data pads.

Also, a DDR2 SDRAM uses a 4-bit prefetch scheme to access 4-bit data stored in memory cells in each clock cycle and output the accessed 4-bit data to data pads.

Likewise, a DDR3 SDRAM uses an 8-bit prefetch scheme to access 8-bit data stored in memory cells in each clock cycle and output the access 8-bit data to data pads.

In the semiconductor memory device, the number of global input/output lines used to input/output data may be defined according to the data bandwidth and the bit number of the prefetch.

For example, since a DDR3 SDRAM having the X8 data bandwidth uses the 8-bit prefetch scheme, 64 (=8×8) global input/output lines are needed to input/output data in one clock cycle. That is, 64 bits of data are simultaneously input/output in the semiconductor memory device.

Also, since a DDR4 SDRAM having the X16 data bandwidth uses the 16-bit prefetch scheme, 256 (=16×16) global input/output lines are needed to input/output data in one clock cycle. That is, 256 bits of data are simultaneously input/output in the semiconductor memory device.

However, if a large number of global input/output lines are simultaneously used, as described above, it is difficult to apply to the semiconductor memory device. That is, as the semiconductor memory device is becoming smaller and smaller, there occurs a problem that the global input/output lines occupy a very large area.

The conventional semiconductor memory device having a plurality of banks reduces the number of the global input/output lines by dividing each bank into a plurality of memory blocks, grouping the memory blocks into a predetermined number of memory block groups, and making the respective memory block groups share the corresponding column select signals.

FIG. 1 is a block diagram illustrating the connection configuration of global input/output lines in a conventional semiconductor memory device having a plurality of banks.

Referring to FIG. 1, the conventional semiconductor memory device includes four banks BANK0, BANK1, BANK2 and BANK3. Eight bits of data are output at a time when one memory is selected among a plurality of memory blocks U0, U1, U2, U3, U4, U5, U6, U7, D0, D1, D2, D3, D4, D5, D6 and D7 included in each of the banks BANK0, BANK1, BANK2 and BANK3. That is, eight global input/output lines are connected to each memory block. It can be seen that the conventional semiconductor memory device illustrated in FIG. 1 is a DDR3 SDRAM with an 8X data bandwidth (8-bit prefetch).

More specifically, each of the banks BANK0, BANK1, BANK2 and BANK3 is divided into upper banks U0, U1, U2, U3, U4, U5, U6 and U7 and lower banks D0, D1, D2, D3, D4, D5, D6 and D7.

Among the upper banks U0, U1, U2, U3, U4, U5, U6 and U7, the zeroth memory block U0 and the fourth memory bank U4 share the global input/output line GIO_04; the first memory block U1 and the fifth memory bank U5 share the global input/output line GIO_15; the second memory block U2 and the sixth memory bank U6 share the global input/output line GIO_26; and the third memory block U3 and the seventh memory bank U7 share the global input/output line GIO_37.

Likewise, among the lower banks D0, D1, D2, D3, D4, D5, D6 and D7, the zeroth memory block D0 and the fourth memory bank D4 share the global input/output line GIO_04; the first memory block D1 and the fifth memory bank D5 share the global input/output line GIO_15; the second memory block D2 and the sixth memory bank D6 share the global input/output line GIO_26; and the third memory block D3 and the seventh memory bank D7 share the global input/output line GIO_37.

In summary, the global input/output line GIO_04 consisting of eight lines is connected to the zeroth and fourth memory blocks U0 and U4 of each upper bank and the zeroth and fourth memory blocks D0 and D4 of each lower bank in the banks BANK0, BANK1, BANK2 and BANK3, and data are input/output therethrough.

The global input/output line GIO_15 consisting of eight lines is connected to the first and fifth memory blocks U1 and U5 of each upper bank and the first and fifth memory blocks D1 and D5 of each lower bank in the banks BANK0, BANK1, BANK2 and BANK3, and data are input/output therethrough.

The global input/output line GIO_26 consisting of eight lines is connected to the second and sixth memory blocks U2 and U6 of each upper bank and the second and sixth memory blocks D2 and D6 of each lower bank in the banks BANK0, BANK1, BANK2 and BANK3, and data are input/output therethrough.

The global input/output line GIO_37 consisting of eight lines is connected to the third and seventh memory blocks U3 and U7 of each upper bank and the third and seventh memory blocks D3 and D7 of each lower bank in the banks BANK0, BANK1, BANK2 and BANK3, and data are input/output therethrough.

FIG. 2 is a timing diagram illustrating the operation of the conventional semiconductor memory device of FIG. 1 having the plurality of banks.

Referring to FIG. 2, in which the clock signal is CLK, the conventional semiconductor memory device having the plurality of banks outputs the data in the following sequence.

First, a column enable signal YAE is toggled twice at a preset interval in response to a read command READ, as indicated by reference numeral ①.

The logic level of a column address signal CA<2> is changed in response to the toggling of the column enable signal YAE, as indicated by reference numeral ②. That is, the column address is applied to select which one of the plurality of banks BANK0, BANK1, BANK2 and BANK3 the data is output from.

At this point, the plurality of banks BANK0, BANK1, BANK2 and BANK3 are divided into the upper banks U0, U1, U2, U3, U4, U5, U6 and U7 and the lower banks D0, D1, D2, D3, D4, D5, D6 and D7. Also, since the semiconductor memory device uses the 8-bit prefetch, the data output in response to the column address is data output from one of the upper banks U0, U1, U2, U3, U4, U5, U6 and U7 or the lower banks D0, D1, D2, D3, D4, D5, D6 and D7 in the selected one of the banks BANK0, BANK1, BANK2 and BANK3. It is assumed herein that the upper banks U0, U1, U2, U3, U4, U5, U6 and U7 are selected.

As the logic level of the column address signal CA<2> changes, a first column select signal CY<i> and a second column select signal CY<j> are alternately toggled, as indicated by reference numeral ③. Data DATA_0, DATA_1, DATA_2 and DATA_3 stored in the zeroth to third memory blocks U0, U1, U2 and U3 of the upper banks are output through the global input/output lines in response to the toggling of the first column select signal CY<i>, and data DATA_4, DATA_5, DATA_6 and DATA_7 stored in the fourth to seventh memory blocks U4, U5, U6 and U7 of the upper banks are output through the global input/output lines in response to the toggling of the second column select signal CY<j>. That is, the zeroth to third memory blocks U0, U1, U2 and U3 of the upper blocks and the fourth to seventh memory blocks U4, U5, U6 and U7 of the upper blocks share the global input/output lines to output the data stored therein in a time division manner.

The data DATA_0, DATA_1, DATA_2 and DATA_3, DATA_4, DATA_5, DATA_6 and DATA_7 output from the upper banks through the global input/output lines are stored in prefetch latches until a data strobe signal DQS is toggled, and then are output in sequence through the predefined data (DQ) pads.

In the configuration of the memory blocks U0, U1, U2, U3, U4, U5, U6, U7, D0, D1, D2, D3, D4, D5, D6 and D7 included in each of the banks BANK0, BANK1, BANK2 and BANK3, the memory blocks sharing the column select signal are spaced relatively apart. For example, the zeroth and fourth memory blocks U0 and U4 of the upper banks are spaced farther apart than the first to third memory blocks.

That is, the global input/output lines connecting the memory blocks sharing the column select signal are relatively long.

Thus, the global input/output lines connecting the different banks are also relatively long. For example, the distance between the zeroth memory block U0 of the zeroth bank BANK0 and the fourth memory block U4 of the first bank BANK1 is relatively longer than the distance between the zeroth bank BANK0 and the first bank BANK1.

As the memory blocks sharing the column select signal are spaced farther apart, the global input/output lines must be longer. This will increase an area occupied by the global input/output lines in the semiconductor memory device. Also, the loading of data passing through the global input/output lines will increase.

As a result, data coupling seriously occurs between the adjacent global input/output lines, making it difficult to transfer data at a high speed. In addition, although it is expected that future semiconductor memory devices will be further miniaturized, it is difficult to develop miniaturized semiconductor memory devices if the global input/output lines occupy a large area therein.

Furthermore, although it is expected that future semiconductor memory devices will operate at a higher speed, it is difficult to develop high-speed semiconductor memory devices if the loading of data passing through the global input/output lines increases.

SUMMARY OF THE INVENTION

Embodiments of the present invention are directed to providing a semiconductor memory device, in which global input/output lines for data transfer are relatively short, thereby minimizing an area occupied by the global input/output lines and minimizing the loading of data passing through the global input/output lines.

In accordance with an aspect of the invention, multiple banks each include multiple memory blocks arranged in column and row directions. The memory blocks are divided into memory block groups, the memory blocks of each group being arranged adjacently in the column direction. Each group shares a corresponding column select signal. Multiple global input/output lines are separately connected to the memory block groups of the respective banks to transfer data of the memory blocks belonging to the respective memory block groups in a time division manner.

BRIEF DESCRIPTION OF THE DRAWINGS

FIG. 4A to 4E illustrate the bank configurations of various semiconductor memory devices according to an embodiment of the invention.

DESCRIPTION OF SPECIFIC EMBODIMENTS

Hereinafter, a semiconductor memory device in accordance with the present invention will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 3:
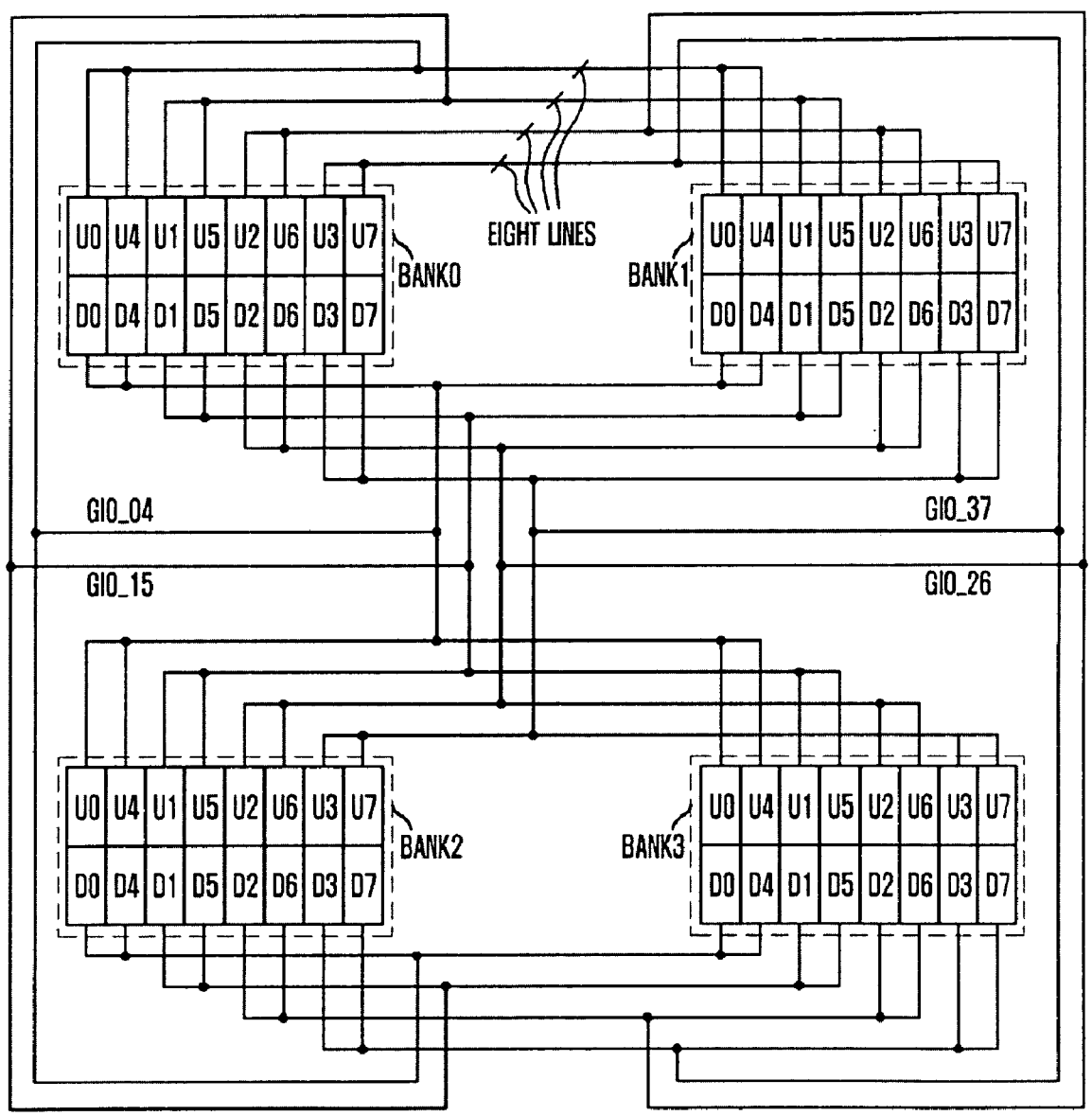
FIG. 3 is a block diagram illustrating the connection configuration of global input/output lines in a semiconductor memory device having a plurality of banks in accordance with an embodiment of the present invention.

FIG. 3 is a block diagram illustrating a configuration of global input/output lines in a semiconductor memory device having a plurality of banks in accordance with an embodiment of the invention.

Referring to FIG. 3, the semiconductor memory device includes four banks BANK0, BANK1, BANK2 and BANK3. Eight bits of data are output at a time when one memory is selected among the memory blocks U0, U1, U2, U3, U4, U5, U6, U7, D0, D1, D2, D3, D4, D5, D6 and D7 included in each of the banks BANK0, BANK1, BANK2 and BANK3. That is, eight global input/output lines are connected to each memory block. It can be seen that the semiconductor memory device illustrated in FIG. 3 is a DDR3 SDRAM with an 8X data bandwidth (8-bit prefetch).

More specifically, each of the banks BANK0, BANK1, BANK2 and BANK3 is divided into upper banks U0, U1, U2, U3, U4, U5, U6 and U7 and lower banks D0, D1, D2, D3, D4, D5, D6 and D7. Among the upper banks U0, U1, U2, U3, U4, U5, U6 and U7, the zeroth memory block U0 and the fourth memory bank U4 share the global input/output line GIO_04; the first memory block U1 and the fifth memory bank U5 share the global input/output line GIO_15; the second memory block U2 and the sixth memory bank U6 share the global input/output line GIO_26; and the third memory block U3 and the seventh memory bank U7 share the global input/output line GIO_37.

Likewise, among the lower banks D0, D1, D2, D3, D4, D5, D6 and D7, the zeroth memory block D0 and the fourth memory bank D4 share the global input/output line GIO_04; the first memory block D1 and the fifth memory bank D5 share the global input/output line GIO_15; the second memory block D2 and the sixth memory bank D6 share the global input/output line GIO_26; and the third memory block D3 and the seventh memory bank D7 share the global input/output line GIO_37.

Figure 1:
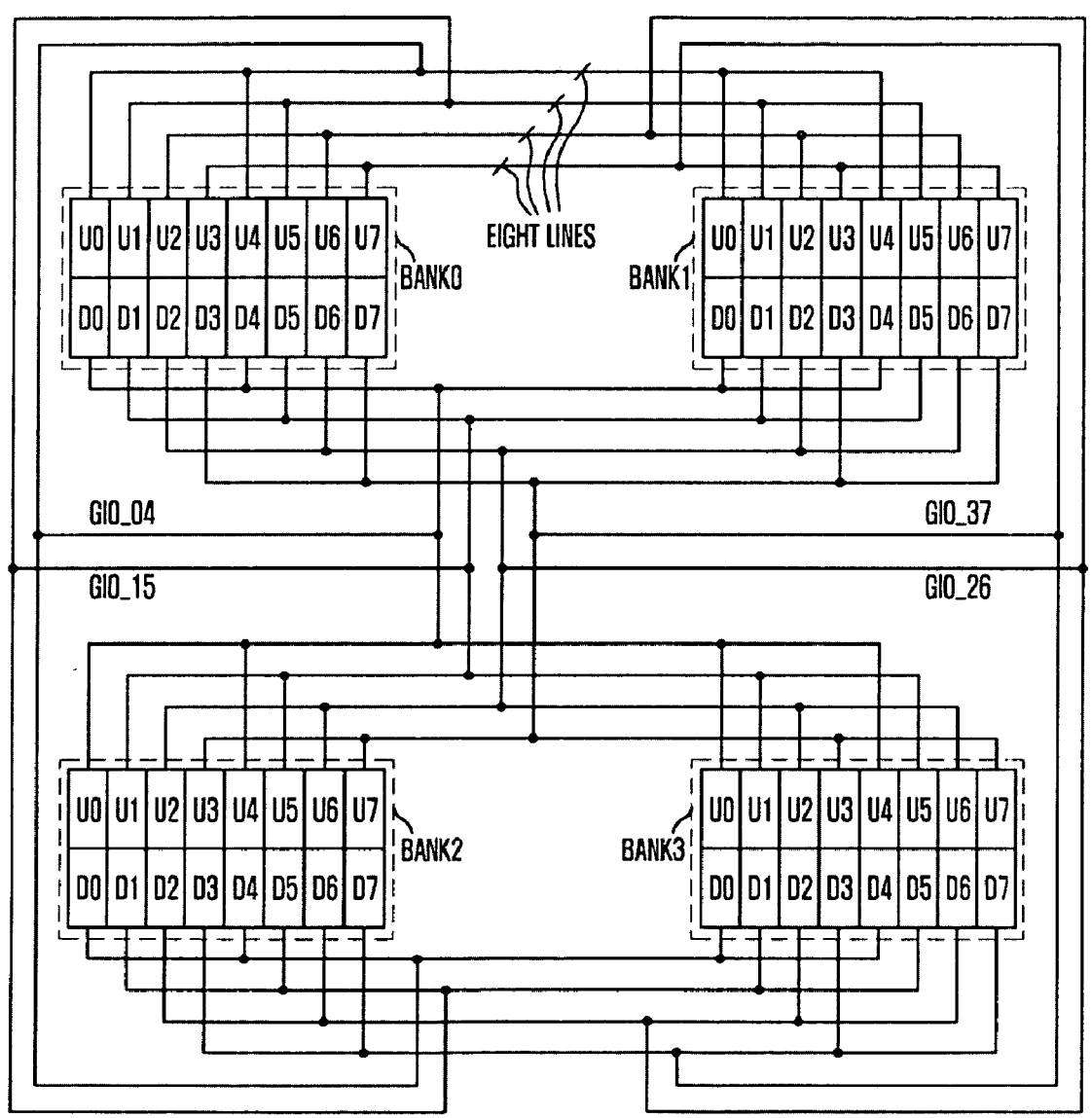
FIG. 1 is a block diagram illustrating the connection configuration of global input/output lines in a conventional semiconductor memory device having a plurality of banks.
Figure 2:
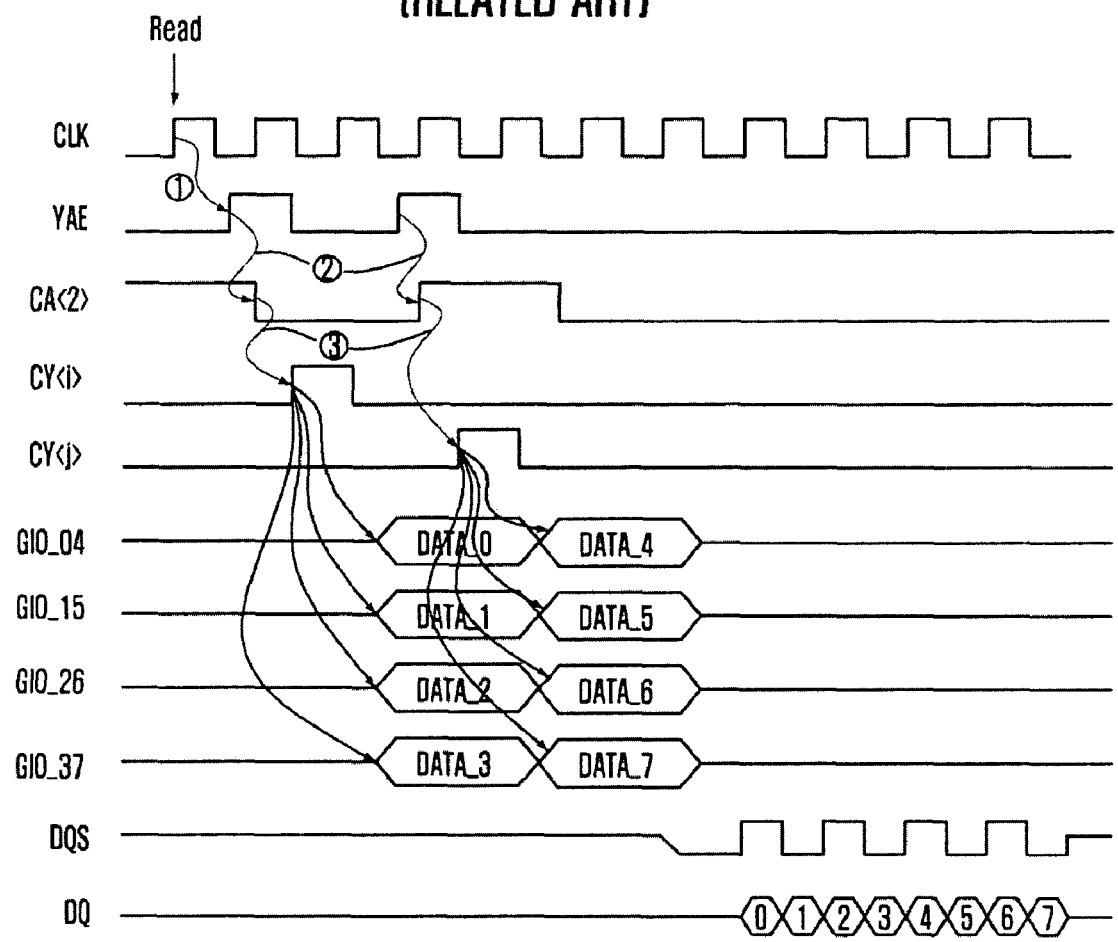
FIG. 2 is a timing diagram illustrating the operation of the conventional semiconductor memory device of FIG. 1.

However, unlike the conventional semiconductor memory device of FIG. 1, the zeroth memory blocks U0 and D0 of the upper and lower banks are adjacent to the fourth memory blocks U4 and D4 in the column direction; the first memory blocks U1 and D1 are adjacent to the fifth memory blocks U5 and D5 in the column direction; the second memory blocks U2 and D2 are adjacent to the sixth memory blocks U6 and D6 in the column direction; and the third memory blocks U3 and D3 are adjacent to the seventh memory blocks U7 and D7 in the column direction.

That is, the memory blocks sharing the column select signal in each of the banks BANK0, BANK1, BANK2 and BANK3 are adjacent in the column direction. Therefore, the length of the global input/output lines shared by the memory blocks sharing the column select signal can be minimized in the banks BANK0, BANK1, BANK2 and BANK3.

Therefore, the global input/output line GIO_04 consisting of eight lines is connected to the zeroth and fourth memory blocks U0 and U4 of each upper bank and the zeroth and fourth memory blocks D0 and D4 of each lower bank in the banks BANK0, BANK1, BANK2 and BANK3, and data are input/output therethrough. The global input/output line GIO_15 consisting of eight lines is connected to the first and fifth memory blocks U1 and U5 of each upper bank and the first and fifth memory blocks D1 and D5 of each lower bank in the banks BANK0, BANK1, BANK2 and BANK3, and data are input/output therethrough. The global input/output line GIO_26 consisting of eight lines is connected to the second and sixth memory blocks U2 and U6 of each upper bank and the second and sixth memory blocks D2 and D6 of each lower bank in the banks BANK0, BANK1, BANK2 and BANK3, and data are input/output therethrough. The global input/output line GIO_37 consisting of eight lines is connected to the third and seventh memory blocks U3 and U7 of each upper bank and the third and seventh memory blocks D3 and D7 of each lower bank in the banks BANK0, BANK1, BANK2 and BANK3, and data are input/output therethrough. At this point, since the memory blocks sharing the column select signal in the respective banks BANK0, BANK1, BANK2 and BANK3 are adjacent to each other in the column direction, the length of the global input/output lines connecting the respective banks BANK0, BANK1, BANK2 and BANK3 can be minimized.

FIG. 4A to 4E illustrate the bank configurations of various semiconductor memory devices according to an embodiment of the invention.

FIG. 4A illustrates the bank configuration of the DDR2 SDRAM performing the 4-bit prefetch operation.

Referring to FIG. 4A, one bank is divided into the upper bank with four memory blocks U0, U1, U2 and U3, and the lower bank with four lower banks D0, D1, D2 and D3. The memory banks U0/U2, U1/U3, D0/D2 and D1/D3 sharing the corresponding column select signals are adjacent to each other.

FIG. 4B illustrates the bank configuration of the DDR3 SDRAM performing the 8-bit prefetch operation. Since the bank configuration of the DDR3 SDRAM has been described above with reference to FIG. 3, detailed description thereof will be omitted.

FIG. 4C illustrates the bank configuration of the DDR4 SDRAM performing the 16-bit prefetch operation.

Referring to FIG. 4C, one bank is divided into the upper bank with sixteen memory blocks U0, U1, U2, U3, U4, U5, U6, U7, U8, U9, U10, U11, U12, U13, U14 and U15, and the lower bank with sixteen lower banks D0, D1, D2, D3, D4, D5, D6, D7, D8, D9, D10, D11, D12, D13, D14 and D15. The memory banks U0/U8, U1/U9, U2/U10, U3/U11, U4/U12, U5/U13, U6/U14, U7/U15, D0/D8, D1/D9, D2/D10, D3/D11, D4/D12, D5/D13, D6/D14 and D7/D15 sharing the corresponding column select signals are adjacent to each other.

FIG. 4D illustrates the bank configuration of the DDR5 SDRAM performing the 32-bit prefetch operation.

Referring to FIG. 4D, one bank is divided into the upper bank with thirty-two memory blocks U0, U1, U2, U3, U4, U5, U6, U7, U8, U9, U10, U11, U12, U13, U14, U15, U16, U17, U18, U19, U20, U21, U22, U23, U24, U24, U25, U26, U27, U28, U29, U30 and U31 and the lower bank with sixteen lower banks D0, D1, D2, D3, D4, D5, D6, D7, D8, D9, D10, D11, D12, D13, D14, D15, D16, D17, D18, D19, D20, D21, D22, D23, D24, D24, D25, D26, D27, D28, D29, D30 and D31. The memory banks U0/U16, U1/U17, U2/U18, U3/U19, U4/U20, U5/U21, U6/U22, U7/U23, U8/U24, U9/U25, U10/U26, U11/U27, U12/U28, U13/U29, U14/U30, U15/U31, D0/D16, D1/D17, D2/D18, D3/D19, D4/D20, D5/D21, D6/D22, D7/D23, D8/D24, D9/D25, D10/D26, D11/D27, D12/D28, D13/D29, D14/D30 and D15/D31 sharing the corresponding column select signals are adjacent to each other.

FIG. 4E illustrates the bank configuration of the semiconductor memory device performing the N-bit prefetch operation. The N memory blocks of the bank are arranged as illustrated in FIG. 4E, and a predetermined number of the adjacent memory blocks share the global input/output lines, thereby minimizing the length of the global input/output lines.

As described above, in the semiconductor memory device having a plurality of banks, a predetermined number of memory blocks sharing the corresponding column select signal are arranged adjacent to each other in the column direction, thereby minimizing the length of the global input/output lines for transferring data output from the adjacent memory blocks in a time division manner.

Hence, a total length of the global input/output lines is reduced. This means the reduction of the area occupied by the global input/output lines. Consequently, the total area of the semiconductor memory device is reduced.

Furthermore, the reduction in the length of the global input/output lines means the reduction in the transfer path of input/output data. The loading of the data input/output in the semiconductor memory device can be minimized, making it possible to input/output data at a faster speed.

As described above, since the area occupied by the global input/output lines is reduced, miniaturized semiconductor memory devices can be developed more easily.

Furthermore, since the loading of the data passing through the global input/output lines is minimized, high-speed semiconductor memory devices can be developed more easily.

While the invention has been described with respect to the specific embodiments, it will be apparent to those skilled in the art that various changes and modifications may be made without departing from the spirit and scope of the invention as defined in the following claims.

Although it has been described in the above embodiments that two memory blocks share the column select signal, it is apparent that more than two memory blocks can share the column select signal.

What is claimed is:

1. A semiconductor memory device, comprising:
    a plurality of banks each including a plurality of memory blocks arranged in column and row directions, the memory blocks being grouped into a plurality of memory block groups each sharing a corresponding column select signal; and
    a plurality of global input/output lines separately connected to the memory block groups of the respective banks to transfer data of the memory blocks included in the respective memory block groups in a time division manner,
    wherein the memory blocks included in the respective memory block groups are arranged adjacently in the row direction.

2. The semiconductor memory device as recited in claim 1, wherein the respective memory block groups each comprise two memory blocks.

3. The semiconductor memory device as recited in claim 1, wherein the memory blocks belonging to the respective memory block groups share eight global input/output lines and transfer 8-bit data at a time in a time division manner, and the respective memory block groups transfer bits of {8×(the number of the memory blocks belonging to the memory block group)} at a time.

4. The semiconductor memory device as recited in claim 1, wherein the semiconductor memory device is a DDR2 SDRAM using a 4-bit prefetch scheme, the respective banks including eight memory blocks forming two rows of four memory blocks arranged in the column direction.

5. The semiconductor memory device as recited in claim 1, wherein the semiconductor memory device is a DDR3 SDRAM using an 8-bit prefetch scheme, the respective banks including sixteen memory blocks forming two rows of eight memory blocks arranged in the column direction.

6. The semiconductor memory device as recited in claim 1, wherein the semiconductor memory device is a DDR4 SDRAM using a 16-bit prefetch scheme, the respective banks including thirty-two memory blocks forming two rows of sixteen memory blocks arranged in the column direction.

7. The semiconductor memory device as recited in claim 1, wherein the semiconductor memory device is a DDR5 SDRAM using a 32-bit prefetch scheme, the respective banks including sixty-four memory blocks forming two rows of thirty-two memory blocks arranged in the column direction.

* * * * *